(12) United States Patent
Berkouk et al.

(10) Patent No.: US 9,899,892 B2
(45) Date of Patent: Feb. 20, 2018

(54) ROTARY ELECTRIC MACHINE

(71) Applicant: BROSE FAHRZEUGTEILE GMBH & CO. KOMMANDITGESELLSCHAFT, WUERZBURG, Wuerzburg (DE)

(72) Inventors: Maurad Berkouk, Le Conquet (FR); Sebastien Labat, Schwanfeld (DE); Eric Fournier, Etival les le Mans (FR)

(73) Assignee: Brose Fahrzeugteile GmbH & Co. Kommanditgesellschaft, Wuerzburg, Wuerzburg (DE)

( * ) Notice: Subject to any disclaimer, the term of this patent is extended or adjusted under 35 U.S.C. 154(b) by 35 days.

(21) Appl. No.: 14/809,706

(22) Filed: Jul. 27, 2015

(65) Prior Publication Data

US 2015/0333596 A1 Nov. 19, 2015

Related U.S. Application Data

(63) Continuation of application No. PCT/EP2014/000190, filed on Jan. 24, 2014.

(30) Foreign Application Priority Data

Jan. 26, 2013 (DE) .................. 10 2013 001 339

(51) Int. Cl.
*H02K 5/22* (2006.01)
*H05K 1/02* (2006.01)
(Continued)

(52) U.S. Cl.
CPC ............ *H02K 5/225* (2013.01); *H02K 11/01* (2016.01); *H02K 11/022* (2013.01); *H02K 11/33* (2016.01);
(Continued)

(58) Field of Classification Search
CPC ............ H02K 3/50; H02K 5/225; H02K 5/24; H02K 29/08; H02K 11/33; H02K 9/02; H02K 2211/03
(Continued)

(56) References Cited

U.S. PATENT DOCUMENTS

| 4,798,984 A | 1/1989 | Suzuki et al. |
| 6,528,915 B1 | 3/2003 | Moskob |

(Continued)

FOREIGN PATENT DOCUMENTS

| CN | 102362413 A | 2/2012 |
| CN | 102449885 A | 5/2012 |

(Continued)

OTHER PUBLICATIONS

Durcansky, Georg: "EMV-gerechtes Geraetedesign 4", Neubearbeitete Aufl., Poing: Franzis, 1995, pp. 396-397, 608-612, ISBN 3-7723-5386-X—Statement of Relevance.

*Primary Examiner* — Hanh Nguyen
*Assistant Examiner* — Leda Pham
(74) *Attorney, Agent, or Firm* — Laurence A. Greenberg; Werner H. Stemer; Ralph E. Locher

(57) ABSTRACT

A rotary electric machine, in particular an electric motor, has a winding, an electronic control device, and an electrically conductive shielding plate arranged between the control device and the winding. A connection device which includes at least one coupling element for electrically connecting the control device to one or more lines and a mass element provided for connecting to an electric mass potential. In order to improve the machine with respect to electromagnetic interference, the shielding plate is electrically conductively connected to the mass element by way of a sheet metal tongue via a first electric pressure-contact.

16 Claims, 18 Drawing Sheets

(51) Int. Cl.
  *H05K 1/18* (2006.01)
  *H05K 3/32* (2006.01)
  *H05K 3/40* (2006.01)
  *H02K 11/22* (2016.01)
  *H02K 11/01* (2016.01)
  *H02K 11/33* (2016.01)
  *H02K 11/40* (2016.01)

(52) U.S. Cl.
  CPC ........... *H02K 11/40* (2016.01); *H05K 1/0213* (2013.01); *H05K 1/18* (2013.01); *H05K 3/325* (2013.01); *H05K 3/4015* (2013.01); *H02K 2211/03* (2013.01); *H05K 3/4046* (2013.01); *H05K 2201/10303* (2013.01)

(58) Field of Classification Search
  USPC ....................................................... 310/68 R
  See application file for complete search history.

(56) References Cited

U.S. PATENT DOCUMENTS

| | | | |
|---|---|---|---|
| 6,872,085 B1 * | 3/2005 | Cohen | .................. H01R 23/688 439/108 |
| 6,888,062 B1 | 5/2005 | Erickson et al. | |
| 8,536,746 B2 | 9/2013 | Kuhnen et al. | |
| 2002/0053843 A1 * | 5/2002 | Sunaga | .................... H02K 3/50 310/68 R |
| 2007/0133183 A1 | 6/2007 | Urbach et al. | |
| 2012/0091839 A1 * | 4/2012 | Hein | ...................... H02K 5/225 310/71 |
| 2012/0161561 A1 * | 6/2012 | Kuhnen | ................. H02K 5/148 310/72 |

FOREIGN PATENT DOCUMENTS

| | | |
|---|---|---|
| DE | 3318362 A1 | 11/1984 |
| DE | 3726839 A1 | 2/1988 |
| DE | 19518215 A1 | 11/1995 |
| DE | 19652652 A1 | 6/1998 |
| DE | 19858627 A1 | 6/2000 |
| DE | 102007008229 A1 | 8/2008 |
| DE | 202009008646 U1 | 11/2010 |
| EP | 1130745 A2 | 9/2001 |
| GB | 2140218 A | 11/1984 |
| GB | 2445775 A | 7/2008 |
| WO | 2005046020 A2 | 5/2005 |

* cited by examiner

ROTARY ELECTRIC MACHINE

CROSS-REFERENCE TO RELATED APPLICATION

This application is a continuation, under 35 U.S.C. § 120, of copending international application No. PCT/EP2014/000190, filed Jan. 24, 2014, which designated the United States; this application also claims the priority, under 35 U.S.C. § 119, of German patent application No. DE 10 2013 001 339.9, filed Jan. 26, 2013; the prior applications are herewith incorporated by reference in their entirety.

BACKGROUND OF THE INVENTION

Field of the Invention

The invention lies in the field of electrical engineering and relates specifically to rotary electrical machines, such as electric motors and generators.

Electric motors are increasingly being used in automotive technology but also in other fields of technology where increasing numbers of electrical drive units are being introduced so as to increase reliability or comfort. Often, so-called brushless motors are used as electric motors, wherein the brushless motors can be controlled in a particularly effective and efficient manner. Motors of this type comprise a stator having an electrical winding that is controlled in such a manner that is suitable so as to generate a rotating magnetic field, wherein a rotor that is driven by way of the magnetic field moves in the rotating electrical field.

Typically, pulse width modulation (PWM) is used so as to control a winding of this type and control voltages having frequencies in the kilohertz (kHz) to megahertz (MHz) range are suitably generated by means of the pulse width modulation in order to generate as a result the rotating fields in the stator winding.

If in particular acoustic problems with a motor of this type are to be avoided, the intention is thus to arrive particularly close to the aim of generating a sinusoidal control voltage for which particularly high switching frequencies in the case of the pulse width modulation are also required. Particular requirements of this type of the control arrangement generate on the other hand electromagnetic waves that are emitted by way of the winding and other parts of the motor or also other parts of a generator that is controlled in a corresponding manner.

An intense emission of electromagnetic waves by way of an electrical machine is not acceptable or not desirable in many fields of technology. It is therefore necessary to meticulously suppress interference from machines of this type and/or to shield machines of this type.

SUMMARY OF THE INVENTION

It is accordingly an object of the invention to provide a rotary electrical machine which overcomes the above-mentioned and other disadvantages of the heretofore-known devices and methods of this general type and of the invention is to provide a rotating electrical machine that is shielded in a particularly effective and efficient manner in order to minimize the emission of electromagnetic signals. In addition, the machine is to be as insensitive as possible with respect to voltage surges or rather voltage arcs.

With the foregoing and other objects in view there is provided, in accordance with the invention, a rotary electrical machine, such as an electric motor, comprising:

a winding;
an electronic control device;
an electrically conductive shielding plate arranged between the control device and the winding;
a connecting device with at least one coupling element for electrically connecting the control device to one or a plurality of lines and a grounding element for connecting to an electrical ground potential; and
a sheet metal tongue electrically connecting the shielding plate to the grounding element by way of an electrical pressure contact.

In other words, the objects of the invention are achieved with a rotating electrical machine in which an electrically conductive shielding plate that is arranged between the control device and the winding is provided between an electronic control device and a winding of the electrical machine. In addition, the rotary electrical machine comprises a connecting device that comprises at least one coupling element for electrically connecting the control device to one or multiple electrical lines and a grounding element for connecting to an electrical ground potential. In accordance with the invention, the shielding plate is connected in an electrically conductive manner to the grounding element by means of a sheet metal tongue by way of a first electrical pressure contact.

The electronic control device of the electrical machine typically comprises field effect transistors, IGBTs, thyristors or similar semiconductor elements or rather semiconductor switches so as to generate a pulse width modulated signal or in general an electrical signal that is suitable for controlling the winding of the machine. In order to create the control arrangement and to supply energy, the control device is connected by means of a connecting device to corresponding drive units so as to supply energy and to perform the control process. The connecting device comprises by way of example a coupling element in the form of a plug connector. In addition, a grounding element is provided and said grounding element can be connected either likewise by way of a plug connector or by way of a fixedly installed grounding line to a ground potential. The corresponding ground potential can be by way of example the plug housing or a corresponding terminal of a plug connection. It can also be provided that a frame, a carrier structure or a support frame of the electrical machine forms the grounding element.

It is important in the context of the invention that in particular the elements of the shielding arrangement of the electrical machine are connected to the grounding element by the shortest path possible. In addition, the transition resistance in the conducting connection to the grounding element is to be as low as possible. This also causes, in addition to reliably shielding the fields and waves, the easy and rapid discharge of excess voltages that can occur as a result of electrical arcs to parts of the shielding, by way of example if charged particles in the path of a cooling air current are brought into contact with parts of the electrical machine.

A sheet metal tongue that is configured in accordance with the invention can reliably connect the shielding plate to the grounding element in an electrically conductive manner, said shielding plate representing part of the shielding arrangement of the electrical machine. The pressure contacting device can be produced in a permanent and reliable manner and compensates both for production tolerances and assembly tolerances.

Often, both the connecting device as well as electronic components are assembled on the same face of a circuit board that is remote from the shielding plate. In this case, it is expedient and technically advantageous if an electrical conductor, such as by way of example the sheet metal tongue in accordance with the invention, is directly connected to and/or contacted by a grounding element on the side of the connecting device that is remote from the shielding plate or on a circuit board of the connecting device and this sheet metal tongue is guided directly through the plane of the circuit board towards the shielding plate. As a consequence, a complicated and long conductor guiding arrangement in the case of the electrically conductive connection between the shielding plate and the grounding element is avoided.

In the electrical connecting path between the shielding plate and the grounding element, bends and curves of conductors and also conductor parts that extend on a circuit board as conductor tracks are avoided which in many cases is expedient and advantageous in order to avoid conductor loops that have impedances. In addition, a sheet metal tongue can be easily extended in a resilient manner so that an electrical pressure contact can be produced in a particularly simple manner using said sheet metal tongue.

The shielding plate is generally formed by a metal plate that extends at least in parts advantageously mostly or even entirely directly adjacent to a circuit board of the control device. In addition to its shielding effect, the shielding plate can also comprise in a case of this type the function of a heat sink for the control device. For this purpose, the shielding plate can also be mechanically connected at one or more sites to the circuit board of the control device so as to transfer heat.

In an advantageous manner, it can be provided that in the region in which the first electrical pressure contact is formed between the sheet metal tongue and the shielding plate, this forms a depression, for example in the form of a beading, so that at that location a spacing or an increased spacing is formed between the shielding plate and a circuit board that is provided in the control device. In addition, the shielding plate can comprise a raised edge that surrounds a circuit board that is located directly adjacent to the shielding plate and shields and protects said circuit board.

By way of example for the purpose of contacting the shielding plate with the grounding element, a resilient rider can also be clamped onto an edge section of the shielding plate that comprises a sheet metal tongue that is pressed in a resilient manner against a conductor track of a circuit board of the control device or directly against the measuring element.

The invention can be advantageously embodied by virtue of the fact that the sheet metal tongue is connected in an electrically conductive manner to the grounding element by means of a connecting conductor that is electrically contacted by means of said sheet metal tongue as a result of a pressure contact.

By way of example, the sheet metal tongue can be pressed in a resilient manner against a connection conductor that is by way of example rigidly connected to the grounding element and/or forms or comprises by way of example a section of a conductor track of the control device.

In addition, the invention can be advantageously embodied by virtue of the fact that the control device comprises a circuit board having conductor tracks and that the sheet metal tongue penetrates the plane of the circuit board, in particular a cut-out in the circuit board and is mechanically held in a clamping device and is also electrically connected to the grounding element or to the shielding plate.

The clamping device can lie by way of example on a side of the circuit board that is remote from the shielding plate. The clamping device can be fastened to the control device and can be supported by said control device. In particular, the clamping device can be fastened to the circuit board. The clamping device can however also be entirely supported by the grounding element and can be rigidly connected to said grounding element.

Advantageously, the clamping device comprises multiple elements, wherein an element, in particular an insulating element, of the clamping device is advantageously connected to the circuit board. It therefore becomes clear that a conductive connection between the clamping device and the sheet metal tongue on one side and the circuit board can be provided, however it is not necessary in all embodiments to contact the shielding plate with the grounding element.

It can also be advantageously provided that at least one element of the clamping device is connected in a rigid manner to the grounding element. The clamping device can therefore be supported by means of the grounding element by way of example by means of a sheet metal strip and can be fastened to said sheet metal strip and can also be simultaneously electrically contacted by said connection.

In accordance with an added feature of the invention, the sheet metal tongue substantially extends in a longitudinal direction and the clamping device comprises at least one guiding rail in which the sheet metal tongue can be guided in a displaceable manner in its longitudinal direction. By way of example, the guiding rail can also be embodied as an electrically conductive element and in addition to the mechanical guiding function can also fulfill the function of the electrical contacting arrangement of the sheet metal tongue.

In accordance with an additional feature of the invention, the clamping device comprises as a further element a counter bearing, by means of which the sheet metal tongue is pressed against the guiding rail. The counter bearing can be embodied by way of example as an electrically insulating component and is connected to the circuit board. The sheet metal tongue can then be held between the counter bearing and the guiding rail in the friction engagement and during assembly can be pressed against the shielding plate whilst applying the necessary force. As a consequence of the intrinsic elasticity of the sheet metal tongue, the pressure of the contacting arrangement between said sheet metal tongue and the shielding plate can be maintained in a perpendicular manner.

In addition however, a latch connection can also be provided and said latch connection fixes the sheet metal tongue in the guiding rail. The latch connection can be provided between the sheet metal tongue on one side and the counter bearing on the other side, however said latch connection can also be provided between the sheet metal tongue and a cut-out or raised area of the guiding rail. A latching link that can be bent out can also be provided on the sheet metal tongue.

For the assembly process, the sheet metal tongue is then to be pushed in the guiding rail to such an extent onto the shielding plate that said sheet metal tongue contacts the shielding plate and latches in the latching mechanism.

In the case that the electrical connection between the grounding element and the shielding plate does not include a conductor section that is embodied as a conductor track on a circuit board, wherein the conductor path is guided entirely independently of the circuit board and the circuit board is penetrated in a movable manner by means of the section of the connection conductor that is embodied as a sheet metal tongue, it can be provided in an advantageous manner that the sheet metal tongue cooperates by means of a second pressure contact section with a conductor track of the circuit board in a pressure contact connection and electrically connects said conductor track by way of the sheet metal tongue to the grounding element.

It is therefore ensured that the connecting line between the grounding element and the shielding plate is embodied in the shortest possible form and that said connection conductor is used in addition to connect a grounding connection of the circuit board to the grounding element.

The sheet metal tongue can advantageously also comprise at least two parts, a front sheet metal strip and a rear sheet metal strip that can be displaced against one another in the longitudinal direction. A latching link of a sheet metal strip can be displaced between a deflected latching position and a non-deflected position by means of displacing the sheet metal strips with respect to one another.

Advantageously, at least parts of the stator and rotor of the motor are connected to ground potential. Expediently, the rotating electrical machine is brushless. In other words, the stator is not electrically contacted by the rotor by means of brushes or the like. In this manner, an electromagnetic interference is further reduced. In particular, the electrical contact does not occur between the rotor and the stator by means of brushes if the stator and rotor are at least in part connected to ground potential. Consequently, the required contacting occurs by way of the bearing between the rotor and the stator.

In accordance with a further embodiment of the invention, the sheet metal tongue is fixed on the circuit board by means of a latching tongue that engages behind the circuit board and that is suitably located on the side of the circuit board that is remote from the shielding plate. In particular, the cross section of the sheet metal tongue is essentially U-shaped, wherein by way of example an element of a clamping device is arranged within this contour. Expediently, the sheet metal tongue is clamped to this element which renders possible a particularly simple fastening arrangement of the sheet metal tongue. As an alternative or in combination therewith, a free end of the sheet metal tongue is guided into a slot of the clamping device and is held in place at that location in a non-positive locking manner.

In a further embodiment of the invention, the sheet metal tongue is cut at a free end, said free end in particular lying opposite the pressure contact, in order to form two arms that by way of example lie essentially flat on the circuit board in the assembled state. In other words, the two arms are angled. The electrical contact between the sheet metal tongue, in particular its arms, and the circuit board is advantageously achieved by means of a limiting ring that is attached to the circuit board and is embodied from an electrically conductive material. The limiting ring forms for example the border of a hole that is integrated into the circuit board.

In another further embodiment of the invention, the sheet metal tongue comprises a clamp that is expediently arranged on a free end that in particular lies opposite the pressure contact. The clamp is by way of example connected to the grounding element, the coupling element or other components of the connecting device, wherein the corresponding component in particular is held in a non-positive locking manner between two clamping arms of the clamp. This renders possible a comparatively simple and rapid assembly of the sheet metal tongue.

In addition to a rotary electrical machine in accordance with the above embodiments having a shielding plate and having a grounding element and also having a connection of the shielding plate to the grounding element by means of a sheet metal tongue, the invention also relates to a control arrangement for an electrical machine, said control arrangement having a circuit board and a resilient sheet metal tongue that penetrates the plane of the circuit board, is held in a clamping device and is connected to a ground potential, said sheet metal tongue being configured so as to produce an electrical pressure contact with an electrically conductive shielding plate that is adjacent to the circuit board.

A control device of this type is generally suitable for assembly with a corresponding electrical machine but can also be constructed, prepared and transported separately from said electrical machine. In addition, the use of a control device of this type is also feasible for various electrical machines, wherein the type of the control device can be adjusted by means of a corresponding embodiment or rather adjustment and initialization of the control device.

Other features which are considered as characteristic for the invention are set forth in the appended claims.

Although the invention is illustrated and described herein as embodied in a rotary electric machine, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
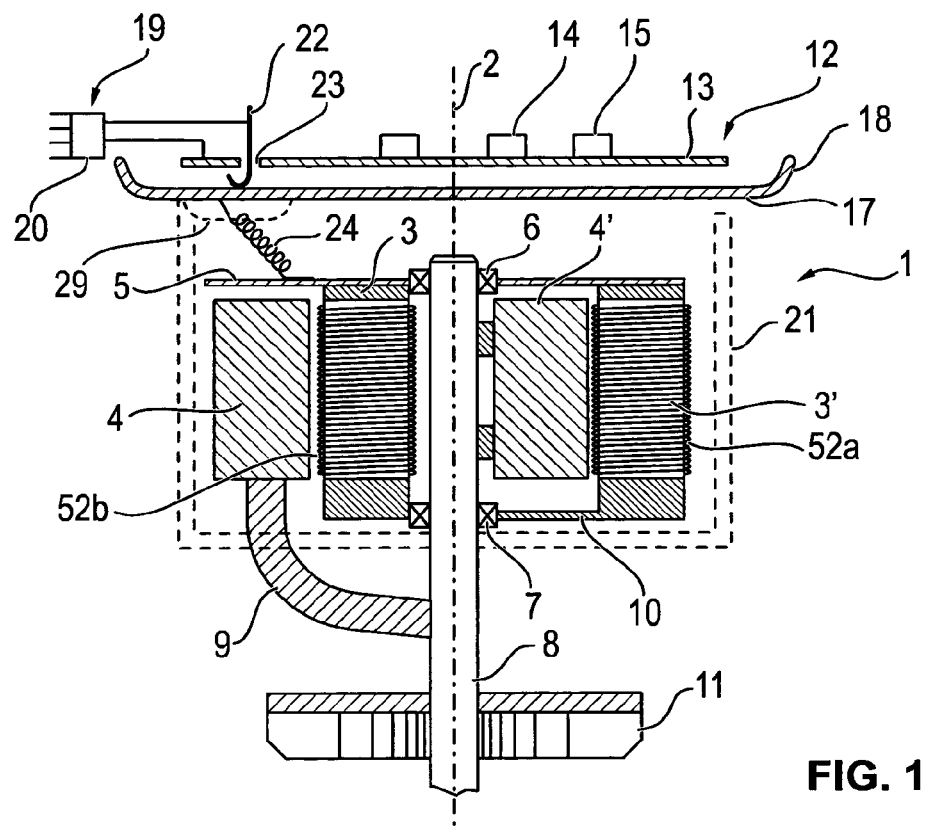
FIG. 1 illustrates a longitudinal section through an electric motor that is illustrated schematically, illustrating on the left-hand side of the illustration an outer rotor and on the right-hand side of the illustration an inner rotor.

Referring now to the figures of the drawing in detail and first, particularly, to FIG. 1 thereof, there is shown, as an exemplary embodiment of the electrical machine, a longitudinal section of a brushless electric motor 1.

Different configurations are illustrated on the left-hand side and the right-hand side of a center line 2. A brushless electric motor having an inner-lying stator 3 and an outer rotor 4 are illustrated on the left-hand side in a half section. The inner-lying stator is connected to a bearing plate 5 on the front end face. A shaft 8 is mounted in a rotatable manner with respect to the bearing plate by means of a first bearing 6 and a second bearing 7 that can be embodied as identical in each case in the left-hand side half section and the right-hand side half section.

In the case of the machine that is illustrated in the left-hand side half section, the outer rotor 4 is connected to the shaft 8 by means of connecting pieces or a bell-shaped device 9 and is supported by means of the shaft. In addition, the outer rotor 4 can still be mounted on the bearing plate 5 by means of a non-illustrated rolling bearing or roller bearing.

An electric motor having an inner armature is illustrated on the right-hand side of the section in FIG. 1. Here, the rotor 4' lies radially within the stator 3'. The stator 3' is fixedly connected to the bearing plate 5 likewise as by way of example to a further bearing plate 10.

The stator 3, 3' is in each case provided with a winding 52a, 52b that surrounds one or multiple stator cores and is connected to a control device 12 by way of control lines in a manner that is not further illustrated.

The shaft 8 is mounted in a rotatable manner on the bearing plates 5, 10 by means of the bearings 6, 7. In addition, the inner-lying rotor 4' is fixedly connected to the shaft 8.

The two constructions are known in the prior art and for the sake of completeness the two constructions are illustrated here since the invention can be used in the case of the two embodiments.

The impeller wheel 11 of a fan/ventilator is indicated in the extension of the shaft 8 in the downwards direction as a functional element that is driven by the shaft.

The control device 12 is illustrated in FIG. 1 above the stator and the rotor and said control device comprises a circuit board 13 and electronic components 14, 15 that are arranged on said circuit board. A shielding plate 17 is arranged between the control device 12, more precisely the circuit board 13, and the bearing plate 5 of the motor and said shielding plate is embodied at least in part from metal or is metalized and comprises an edge 18 that is flared upwards towards the circuit board. In addition, the shielding plate 17 can be used as a heat sink for the control device 12 and can be fixedly connected to the circuit board 13.

The control device 12 is connected to a connection device 19 that comprises, inter alia, a coupling element for electrically connecting to lines in the form of a part of a plug connector 20. In addition, a housing of the plug connector 20 is connected to ground potential in the illustrated example and can form a grounding element.

In addition in FIG. 1, the implementation and effect of an electrical shielding arrangement of the motor is illustrated by means of the dashed double contour 21. The double contour 21 forms a bell-shaped cover that is additionally closed on its open side by means of the shielding plate 17 so that the parts of the stator and the rotor that might emit electromagnetic radiation towards the exterior do not output electromagnetic radiation or output such radiation as little as possible.

In addition, specifically the control device 12 is also particularly well shielded with respect to the winding of the motor by means of the shielding plate 17.

The double contour 21 can be formed by way of example as an entire contour by means of the earthed parts of stator and rotor of the motor, however said double contour can also be embodied in an additional metalized component that surrounds these mentioned components of the motor. It can also be by way of example a motor housing.

Fundamentally, however, it is not necessary for the double contour 21 to describe a specific component, rather said double contour can symbolize only the electromagnetic shielding function that is ensured by means of the present invention.

Various measures are provided in accordance with the present invention in order to connect the parts of the stator and the rotor of the motor that are provided for this purpose and also the shielding plate 17 to the ground potential in an effective manner.

On the one hand, the shielding plate 17 is to be connected to a grounding element of the connecting device with as small as possible an electrical resistance and in the shortest possible path, said grounding element being connected to ground potential. For this purpose, a sheet metal tongue 22 that is only indicated schematically in FIG. 1 is provided and said sheet metal tongue is connected to the connecting device by a short path and for its part produces an electrical pressure contact with the shielding plate 17. The sheet metal tongue 22 penetrates the plane of the circuit board 13. For this purpose, the circuit board 13 comprises a through-going opening 23.

The guiding arrangement of the sheet metal tongue is specifically further illustrated in detail herein under with reference to exemplary embodiments.

In order to achieve the shielding function of the parts of the stator and rotor of the motor that are connected to ground potential, an as reliable as possible and short connection of the bearing plate 5 to the shielding plate 17 is provided. This connection comprises a contact bridge 24 that on the one hand is reliably and effectively contacted in an electrically conductive manner by the shielding plate 17 on one side and by the bearing plate 5 on the other side and that comprises on the other hand sufficient flexibility in order to compensate for production tolerances during the assembly of the motor on the one hand and also to compensate for movements during operation between the shielding plate 17 or the control device 12 and the stator and the rotor of the motor on the other hand.

The embodiment of the contact bridge 24 is likewise more precisely further explained herein under with reference to specific exemplary embodiments.

Figure 2:
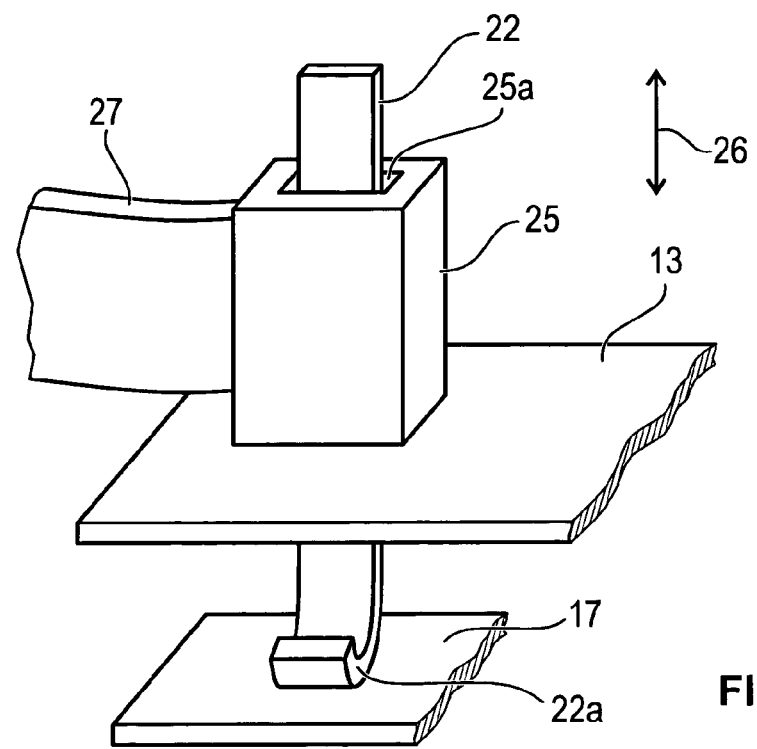
FIG. 2 illustrates a sheet metal tongue having a guiding rail for connecting a shielding plate to a grounding element.

FIG. 2 illustrates in a three-dimensional view the circuit board 13 and also the sheet metal tongue 22 that penetrates said circuit board and said sheet metal tongue contacts the shielding plate 17 below the circuit board 13 by means of a pressure contact. The circuit board 13 and the shielding plate 17 are only partially illustrated.

The sheet metal tongue 22 is illustrated as a flatter, resiliently bendable sheet metal body that comprises a pressure contact piece 22a that is embodied as bow-shaped on its end that is facing from the shielding plate 17. This pressure contact piece 22a can be deformed in a resilient manner so that a permanent and reliable pressure contact to the shielding plate 17 can be produced by means of compensating tolerances using a resilient pressing force by means of resiliently deforming the sheet metal tongue.

The sheet metal tongue 22 is advantageously on the one hand mechanically held in a clamping device 25 and on the other hand is electrically contacted. The clamping device 25 is therefore advantageously embodied at least in part from a material that is very conductive.

The sheet metal tongue is held within the clamping device 25 either in a non-positive locking manner, in other words by means of friction or by means of a latching arrangement and in particular is fixed in the direction perpendicular to the surface of the circuit board 13, as is indicated by means of the double arrow 26.

The clamping device 25 is connected to a grounding element of the connecting device 19 by means of a connecting lug 27. By way of example, the contact lug can be embodied as a rigid metal sheet that is connected to the clamping device 25 in a single part manner or by means of an adhesive, soldered or welded connection and that is rigidly connected in a manner that is not further illustrated in FIG. 2 to the housing of the coupling element 20 that is connected to ground potential, in other words is connected by way of example to a plug housing.

The clamping device 25 can be fixed to the circuit plate, however said clamping device can also be movable with respect to said circuit board and not connected to said circuit board and held exclusively by the contact lug 27.

In the guiding duct 25a that is formed in the clamping device 25 for the sheet metal tongue 22 and represents a guiding rail for the sheet metal tongue 22, the sheet metal tongue can be fixedly clamped in the lateral direction perpendicular to the direction of the double arrow 26 in a non-positive locking manner by means of an attached metal or synthetic material part. The sheet metal tongue 22 can also comprise a bent section that can be clamped within the guiding duct 25a. In addition, it is also possible within the guiding duct 25a to provide a latching arrangement between the sheet metal tongue 22 and a metal or synthetic material part of the clamping device 25.

By way of example, a synthetic material part of the latching apparatus can also be fixedly connected to the circuit board 13 or to parts of the clamping device.

In connection with feeding the sheet metal tongue 22 through the opening of the circuit board 13, a ground conductor in the form of a conductor track that is provided at that location can also be contacted by the sheet metal tongue 22 in the plane of the circuit board 13. On one hand, a conductor track of the circuit board can be connected in this manner by means of the sheet metal tongue 22 to the grounding element, however on the other hand it can also be provided that the grounding element is connected to the conductor track of the circuit board in another manner by a short path and the sheet metal tongue 22 is exclusively connected to the grounding element by way of the conductor track of the circuit board 13. In this case, the sheet metal tongue 22 is used to produce a conductive connection between the conductor track of the circuit board 13, said conductor track being connected to ground potential, and the shielding plate 17.

If the clamping device 25 is fixedly connected to the circuit board 13, the contact lug 27 can also be achieved by means of a flexible conductor.

The opening 23 in the circuit board through which the sheet metal tongue 22 extends can also by way of example lie on the edge of the circuit board 13 and can be open towards the edge, in other words can merely represent a lateral cut-out of the circuit board 13.

Figure 3:
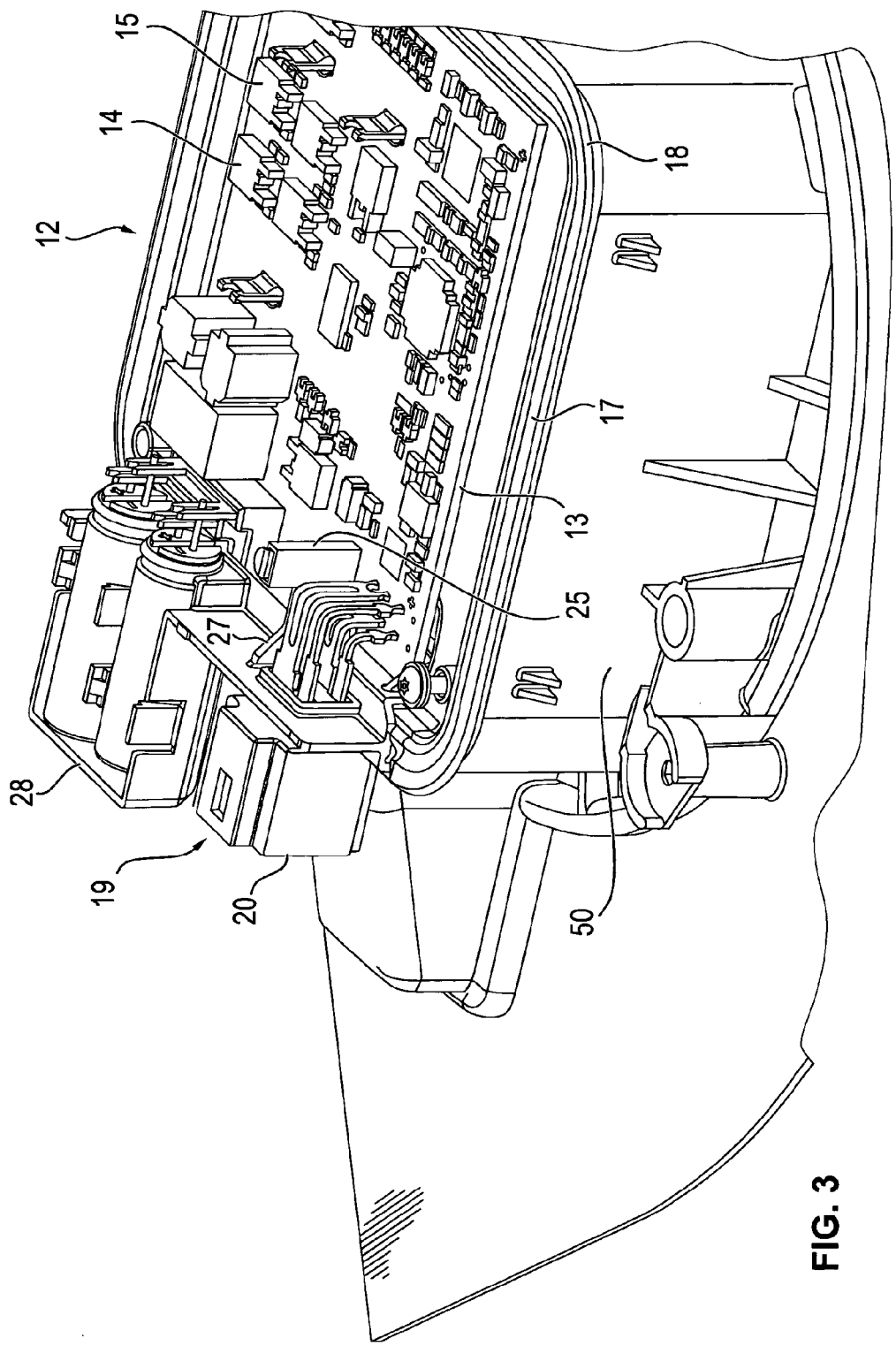
FIG. 3 illustrates a three-dimensional view of a control device and also of a motor housing.

FIG. 3 illustrates in a three-dimensional view an electric motor having a housing 50 and also a control device 12 having a circuit board 13 and a shielding plate 17 having a flared edge 18, said shielding plate being arranged in the figure below the circuit board 13. The shielding plate 17 can be by way of example in close contact with the circuit board 13 so that the shielding plate 17 can simultaneously be used as a heat sink for the electronic components of the circuit board 13. Heat bridges can be provided between the circuit board 13 and the shielding plate 17 and the two elements can also be directly bonded to one another.

The shielding plate 17 is connected to the housing 50 in a manner that is not further illustrated. Various electronic components 14, 15 are visible in the figure on the surface of the circuit board 13, among which by way of example are thyristors, IGBTs or similar semiconductor components, and said semiconductor components render it possible to control the winding of the motor by means of high frequency pulse width modulated signals.

A connecting device 19 is likewise evident in FIG. 3, said connecting device having a coupling element 20 in the form of a part of a plug connection, wherein the coupling element 20 is embodied as a plug housing having contact pins that lie in its interior. The plug housing 20 is by way of example directly connected to the ground potential or includes a contact pin that for its part is connected to the ground potential.

FIG. 3 illustrates a contact lug 27 on the populated side of the circuit board 13 of the connecting device 19, said contact lug being embodied as by way of example a welded metal sheet that is fixedly connected to a frame 28 of the connecting device 19. In this case, the frame 28 of the connecting device can form a grounding element.

In addition, the clamping device 25 is evident in FIG. 3 and a sheet metal tongue protrudes upwards out of said clamping device.

Figure 4:
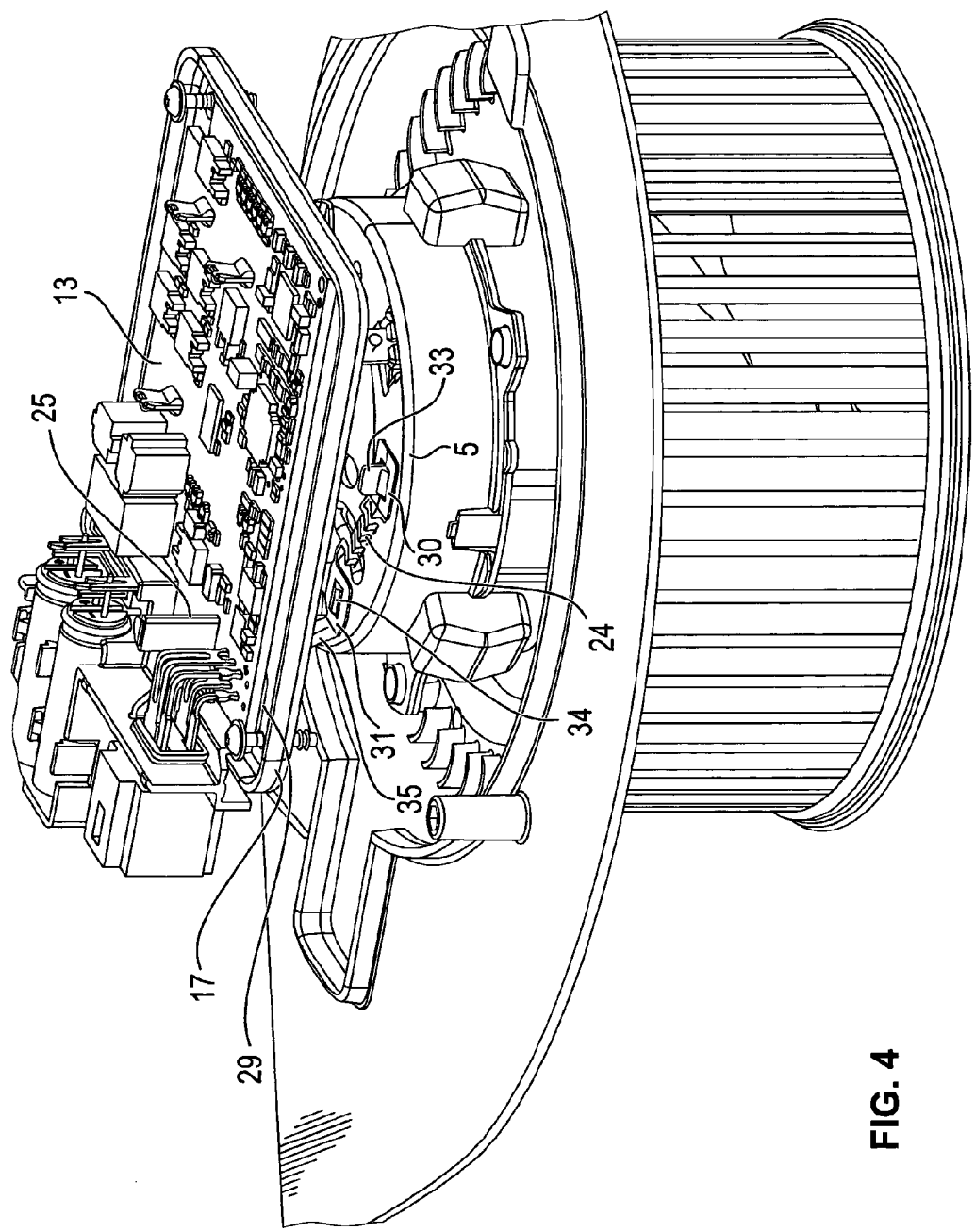
FIG. 4 illustrates a three-dimensional view of a control device having an electric motor in the case of a housing that is in part omitted.

FIG. 4 illustrates from a somewhat changed angle of view the construction of FIG. 3, wherein it is to be noted that the shielding plate 17 comprises a depression 29 in the region of the cut-out in the circuit board 13 and the sheet metal tongue protrudes through said cut-out in the region of the clamping device 25 so that in this region, the gap between the shielding plate 17 and the circuit board 13 is enlarged and space is formed for a pressure contacting device or rather for a pressure contact piece 22a of the sheet metal tongue 22.

The depression is illustrated in a cross section in FIG. 1 by means of a dashed line in the region of the sheet metal tongue below the shielding plate 17.

The connection of the shielding plate to a bearing plate 5 of the motor in the form of the contact bridge 24 is also illustrated below the shielding plate 17 in FIG. 4.

The contact bridge comprises a first fastening section 30 and also a second fastening section 31 and a bridging element 32 between two said fastening sections. Said bridging element is further detailed below.

The fastening sections 30, 31 of the contact bridge 24 are plugged onto contact protrusions 33, 34 that are either only used to fasten or to fasten and to electrically contact the contact bridge. In addition, it is evident in FIG. 4 that the contact bridge 24 comprises a resilient contact arm 35 on the side of the second fastening section 31 that is remote from the first fastening section 30 and said contact arm is aligned in the direction towards the underside of the shielding plate 17 and contacts said shielding plate.

Figure 5:
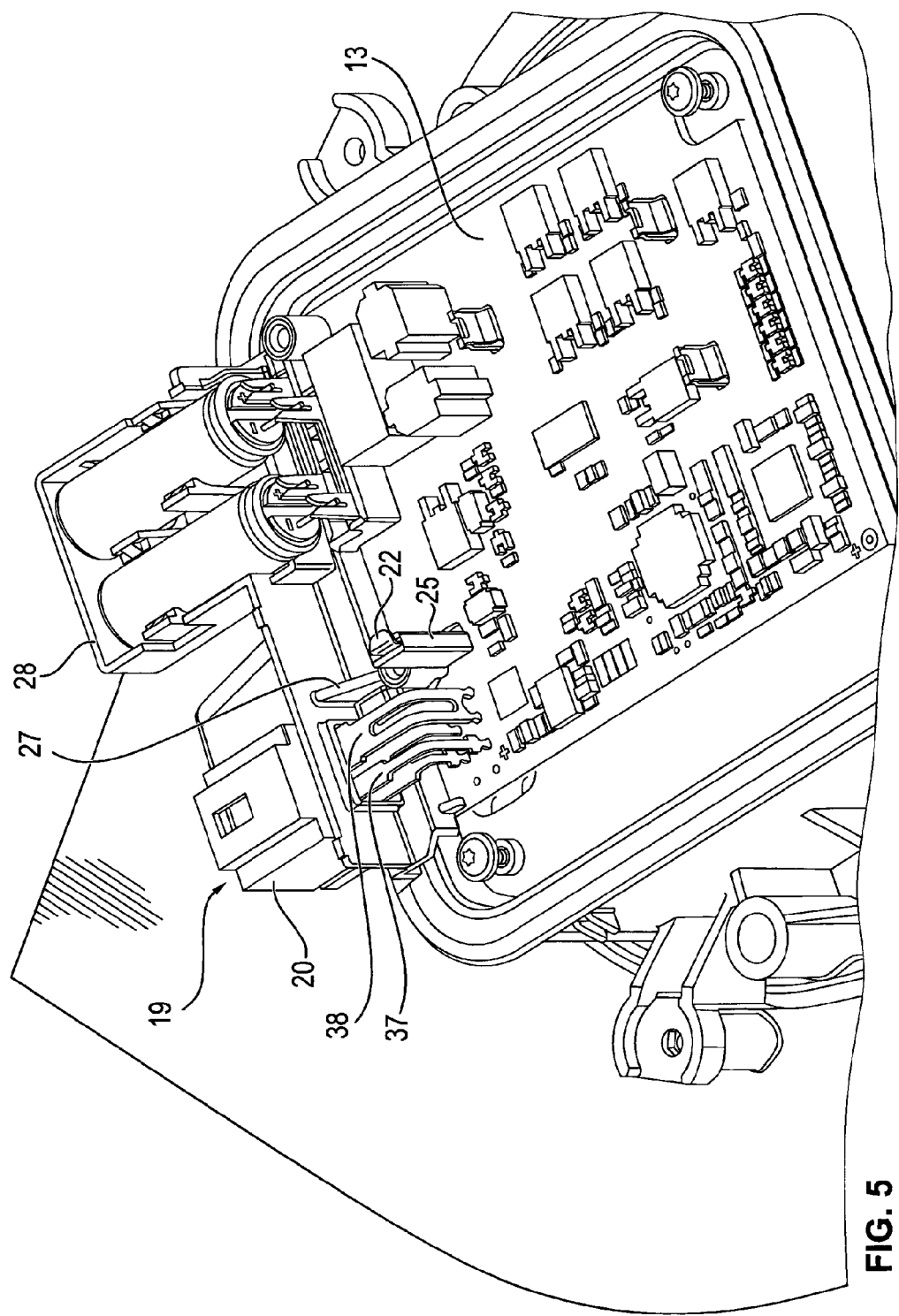
FIG. 5 illustrates a view of a control device for an electric motor as seen from the populated side of the circuit board.

FIG. 5 illustrates in a further three-dimensional view the upper side of the electric motor that is previously illustrated in FIGS. 3 and 4, wherein the clamping device 25 having the sheet metal tongue 22 and the contact lug 27 is particularly evident. A hollow cylindrical metal contact element 36 is inserted between the contact lug 27 and the clamping device 25 and said contact element connects the contact lug 27 to the clamping device 25. In addition, it is evident that the contact pins of the coupling element 20 on the side of the circuit board 13 are connected in each case to conductor tracks of the circuit board 13 by way of connector conductors 37, 38. However, in the case of this embodiment, no connector conductors of the connecting device 19 that are connected to ground potential are directly connected to a conductor track of the circuit board 13 so that the parts of the control device that are to be connected to the ground potential are exclusively connected to the grounding element/frame 28 by way of the contact lug 27 or rather the sheet metal tongue 22.

FIGS. 6 to 9 that are further described in the following illustrate various views of various, easily varied clamping devices that can be used within the scope of the invention.

Figure 6:
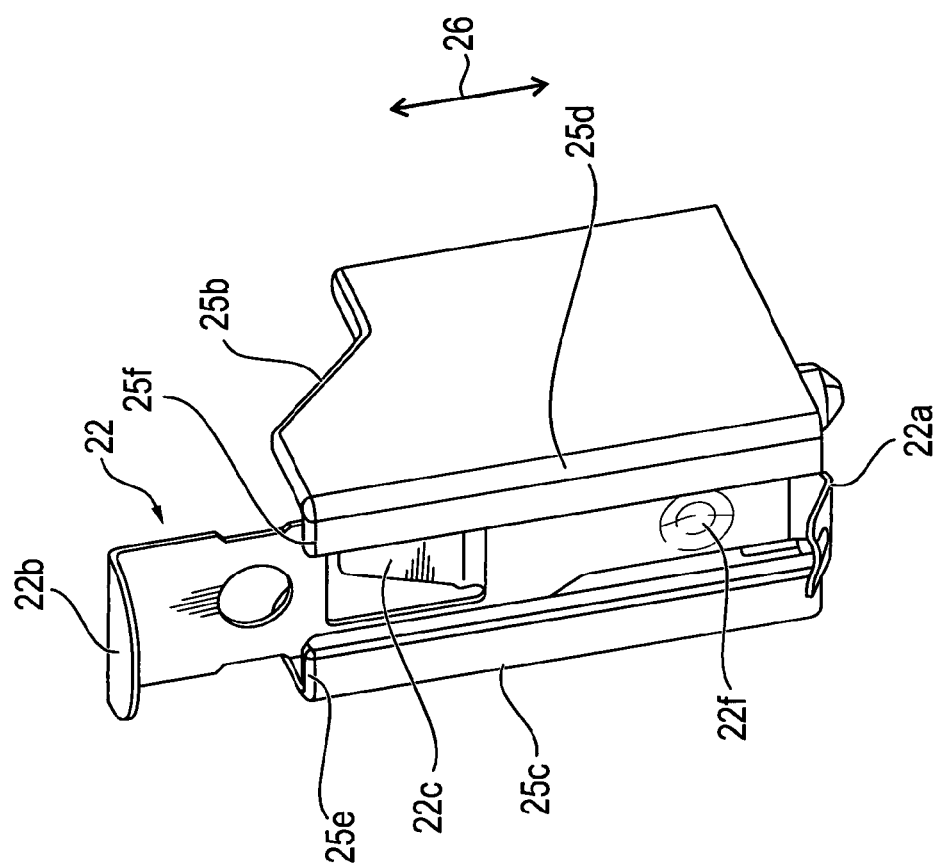
FIG. 6 illustrates a sheet metal tongue having a guiding rail in a three-dimensional illustration.

FIG. 6 illustrates in this context a guiding rail 25b that comprises two side walls 25c and 25d between which the sheet metal tongue 22 can be displaced in the direction of the double arrow 26. The side walls 25c, 25d comprise in each case termination angles 25e, 25f that in part cover the front end face of the sheet metal tongue 22 and form a guiding surface for the sheet metal tongue 22.

The sheet metal tongue 22 comprises on its upper end a flat piece 22b that is embodied as a right-angled end of the sheet metal tongue and that by way of example can be used to manipulate the sheet metal tongue 22 in other words specifically to insert said sheet metal tongue into the clamping device 25.

The pressure contact piece 22a in the form of a likewise curved end having an impressed beading 22f is evident on the lower end of the sheet metal tongue 22 said end being opposite the flat piece.

Within its length, the sheet metal tongue comprises a latching lug 22c that is embodied as a punched-free sheet metal tongue part that is bent out into the drawing plane in the illustration of FIG. 6. Whilst inserting the sheet metal tongue 22 into the clamping device 25, this latching lug 22c, that can be a punched-free sheet metal link, can latch behind a protrusion of a part of the clamping device 25, whereby the sheet metal tongue 22 is prevented from being displaced out of the clamping device 25. This is further explained below in connection with FIG. 8.

Figure 7:
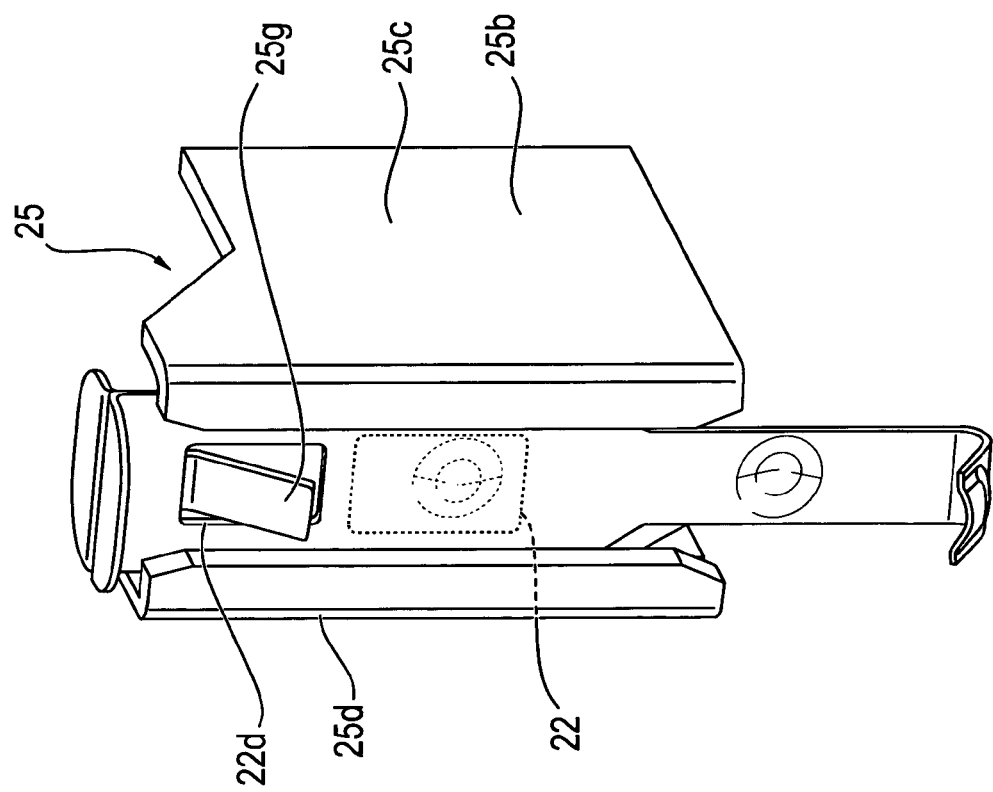
FIGS. 7 and 8 illustrate further illustrations of a sheet metal tongue in accordance with FIG. 6 from other viewing directions.

FIG. 7 illustrates an arrangement in which the sheet metal tongue 22 comprises a latching opening 22b that cooperates with a protruding lug 25g of the clamping device whilst the sheet metal tongue is being inserted into the clamping device 25 so as to create a latching arrangement.

The lug 25g can be by way of example a part of a component that is not evident in FIG. 7 and is fixed between the two walls 25c, 25d and that by way of example can be embodied from metal or synthetic material.

Figure 8:
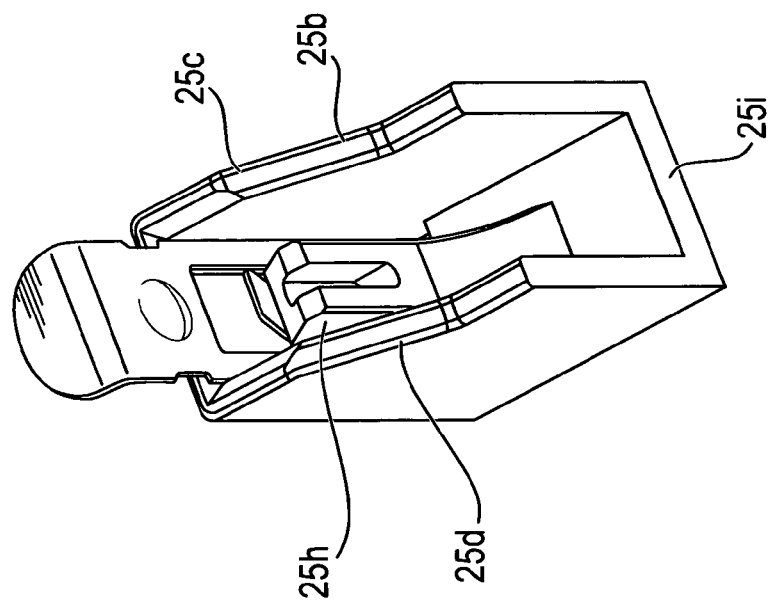

FIG. 8 illustrates from the opened side of the clamping device 25b the intermediate space between the side walls 25c and 25d, where a counter bearing 25h is arranged, said counter bearing 25h comprising a latching lug and can be embodied from a metal or synthetic material. The counter bearing 25h can by way of example be fastened to the base 25i of the clamping device 25, said base extending between the side walls 25c and 25d. A punched-free sheet metal link part of the sheet metal tongue is illustrated that can latch with the latching lug.

Figure 9:
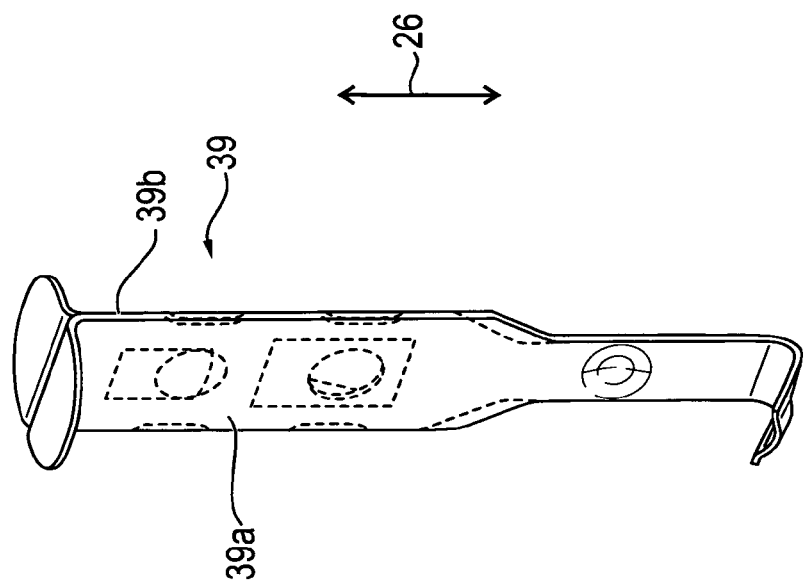
FIG. 9 illustrates a sheet metal tongue as is illustrated in FIGS. 6 to 8, without the guiding rail.

FIG. 9 illustrates a sheet metal tongue 39 that comprises a front sheet metal strip 39a and a rear sheet metal strip 39b that is in part congruent to said front sheet metal strip, said sheet metal strips lying one on top of the other and being able to be displaced with respect to one another in their longitudinal direction (double arrow 26). By way of example, a sheet metal link can be deformed in one of the sheet metal strips by means of displacing the sheet metal strips with respect to one another, and said sheet metal link functions as a latching lug so as to unlock from a latching lug of the clamping device. For this purpose by way of example, the rear sheet metal strip 39b comprises an opening that can be penetrated by a sheet metal link of the front sheet metal strip so as to latch to a latching lug. The opening in the rear sheet metal strip is displaced and bent back with respect to the sheet metal link of the front sheet metal strip by means of displacing and bending back the rear sheet metal strip with respect to the front sheet metal strip.

Figure 10:
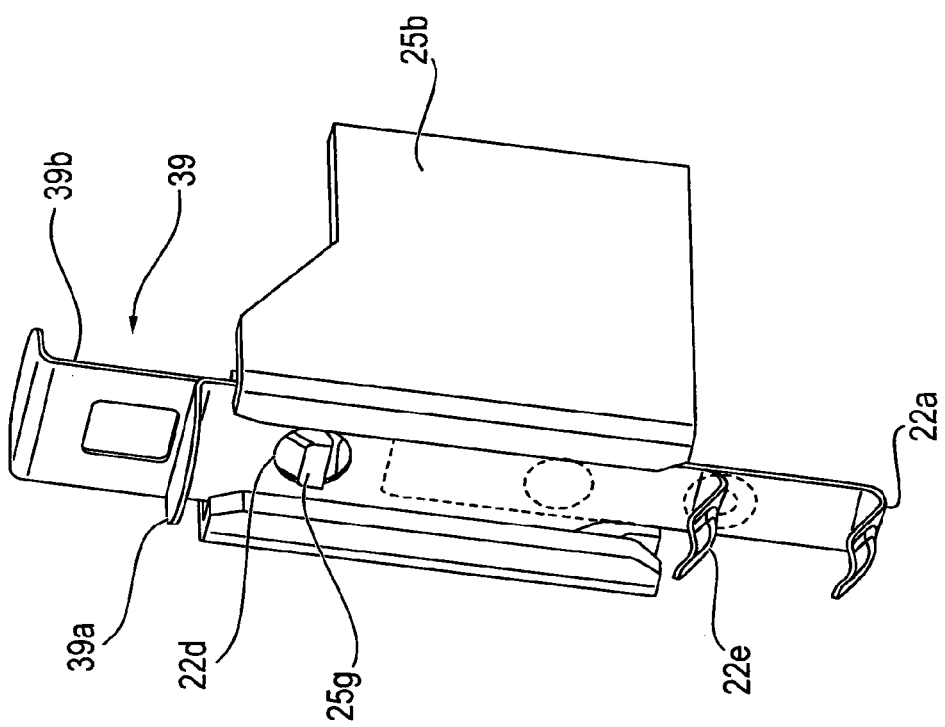
FIG. 10 illustrates another embodiment of a sheet metal tongue having a guiding rail.

FIG. 10 illustrates a clamping device 25 having a guiding rail 25b and also a sheet metal tongue 39 that is constructed as is described with reference to FIG. 9. The front sheet metal strip 39a and the rear sheet metal strip 39b are displaced with respect to one another in such a manner that they can latch with the latching lug 25g of the clamping device. This protrudes through an opening 22d in the sheet metal tongue.

In addition, it is illustrated that a pressure contact piece 22a protrudes downwards through the opening that is not illustrated in the circuit board and as far as the shielding plate. A second pressure contact piece 22e is illustrated that is used to contact the sheet metal tongue 39 to the circuit board 13 or rather to a conductor track that is provided at that location by means of a beading that is provided in the contact piece 22e. The two pressure contact pieces 22a, 22e can be provided at in each case different sheet metal strips/parts 39a, 39b of the sheet metal tongue 39 or jointly on the same sheet metal strips/parts.

The latching arrangement of the lug 25b in the latching opening 22d can be cancelled by means of displacing the part 39b of the sheet metal tongue 39 with respect to the part 39a.

Figure 11:
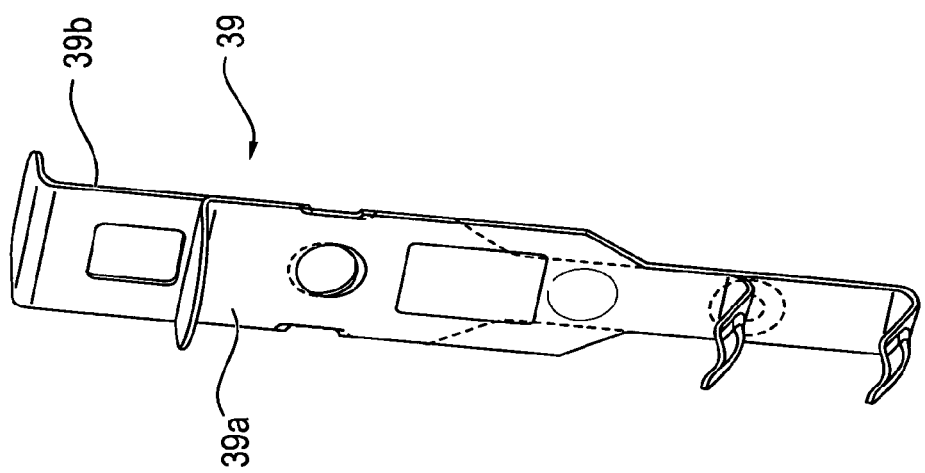
FIG. 11 illustrates a sheet metal tongue as is illustrated in FIG. 10, without the guiding rail.
Figure 12:
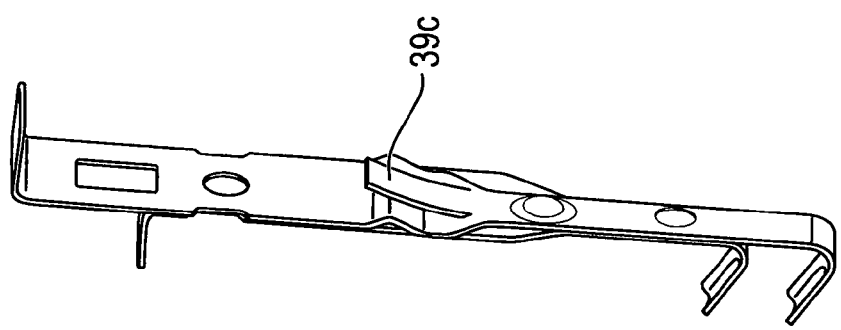
FIG. 12 illustrates a sheet metal tongue as is illustrated in FIG. 11, from another view.

FIG. 11 illustrates the sheet metal tongue 39 with the front sheet metal strip 39a and the rear sheet metal strip 39b in a full view from a first side, whereas FIG. 12 illustrates the same combination as in FIG. 11 from the opposite side with the latching lug 39c.

Figure 13:
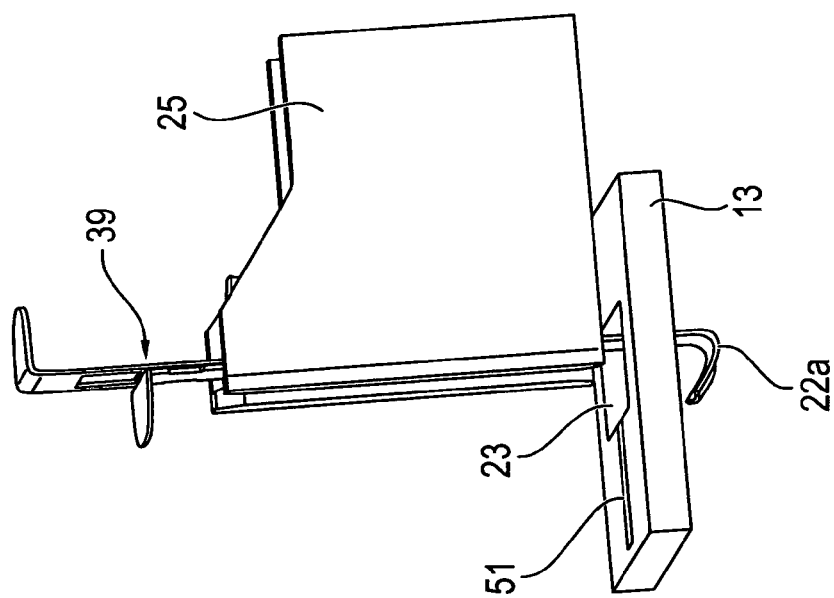
FIG. 13 illustrates a sheet metal tongue in a guiding rail as is illustrated in FIG. 10, in another view.

FIG. 13 illustrates the clamping device 25 having the sheet metal tongue 39 that protrudes through the opening 23 in the circuit board 13 and also the pressure contact piece 22a that is to be contacted below the circuit board 13 by the shielding plate 17.

Figure 14:
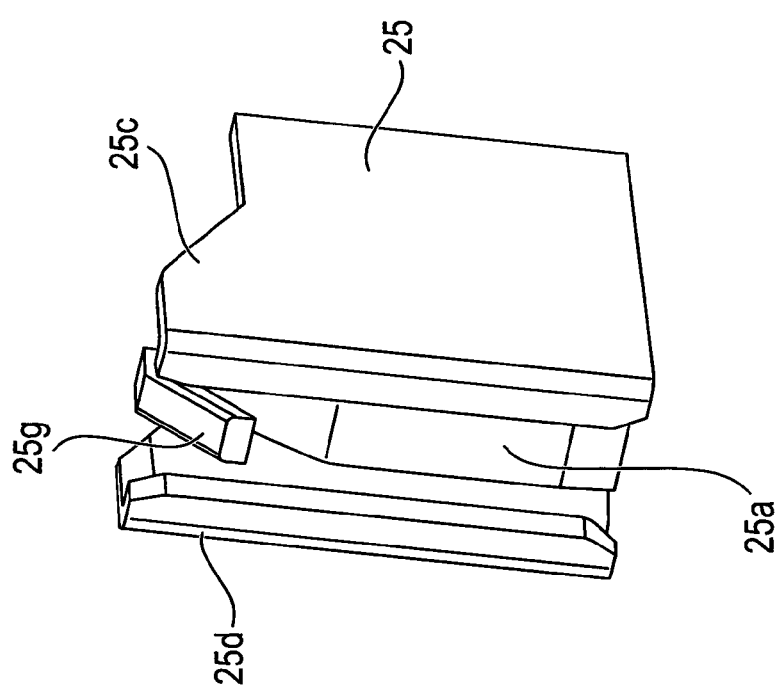
FIG. 14 illustrates a guiding rail for a sheet metal tongue corresponding to the FIGS. 10 to 13.

FIG. 14 illustrates the clamping device 25 having the two side walls 25c, 25d and a component 25h that is provided between said side walls and said component supports the lug 25g. The lug 25g can be deformed by way of example in a resilient manner and can be removed from the movement track of the sheet metal tongue in the clamping device 25 by means of a pressing force.

Figure 15:
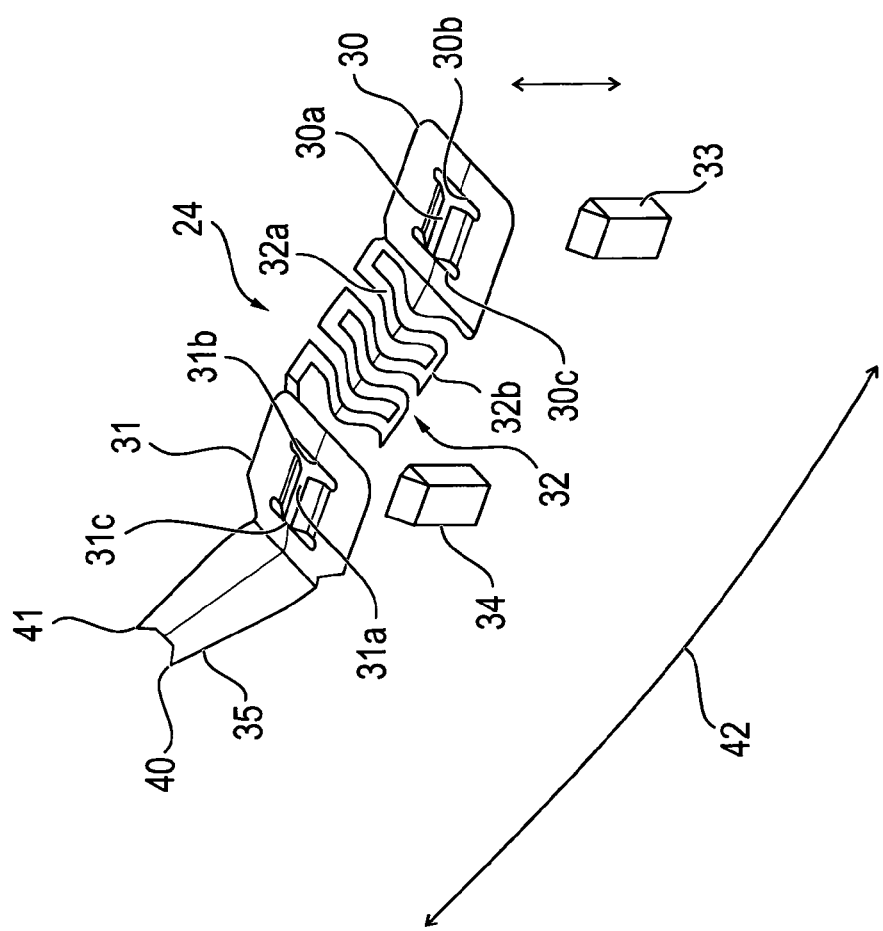
FIG. 15 illustrates a bridging element for connecting a stator of an electrical machine to a grounding element.

FIG. 15 illustrates in a three-dimensional view a contact bridge 24 having a first fastening section 30 and a second fastening section 31 and also a bridging element 32 that is arranged between said fastening sections. Both the fastening sections 30, 31 as well as the bridging element 32 and a contact arm 35 that is connected to the fastening section 31 are advantageously produced in a single part manner from a single resilient metal sheet, by way of example by means of punching or laser cutting a planar resilient sheet.

The fastening sections 30, 31 are in each case embodied as extensive planar sections and comprise in each case a through-going clamping opening 30a, 31a that in each case is embodied in the exemplary embodiment as a straight clamping slot. In each case separating slots 30b, 30c and also 31b, 31c are arranged at the two ends of the clamping slots 30a, 31a and said separating slots extend in each case in a transverse manner, in particular in a perpendicular manner with respect to the clamping slots 30a, 31a. Edge strips are formed in each case in the fastening sections 30, 31 by means of the separating strips 30b, 30c, 31b, 31c and said edge strips extend parallel adjacent to the respective clamping slots and can be bent out of the plane of the fastening sections.

The contact bridge 24 can be attached to the clamping protrusions 33, 34 in such a manner that said clamping protrusions penetrate the clamping slots 30a, 31a whilst bending the edge regions and are clamped at that location. As a result of the specific design of the edge regions, said edge regions are actively hooked into the clamping protrusions 33, 34 which leads to particularly good stability with respect to pulling the contact bridge 24 away from the clamping protrusions.

The bridging element 32 is provided between the fastening sections 30, 31 and said bridging element is embodied as a meandering, planar sheet metal conductor in order to make the bridging element as flexible as possible with respect to movements at all sides of the fastening sections 30, 31.

The individual conductor sections 32a, 32b of the meandering conductor arrangement are embodied as bent in order to achieve as much flexibility as possible.

A contact arm 35 is connected to the second fastening section 31 in a single part manner and said contact arm comprises contact tips 40, 41 on its free end and said contact tips are pressed in the contacting state in a resilient manner against the underside of the shielding plate 17. After assembly, the contact arm 35 produces a resilient, electrically conductive connection of the contact bridge 24 to the shielding plate 17 and therefore also produces a contact between the shielding plate and by way of example the bearing plate of the electric motor and the clamping protrusion 33 is fastened to said shielding plate.

Other contacting fastening types of the contact bridge are feasible in lieu of the clamping protrusions 33, 34, such as by way of example the fastening arrangement by means of a screw. The fastening arrangement by means of clamping protrusions, onto which it is possible to slide the fastening sections, is however particularly advantageous with regard to assembly.

It is evident from FIG. 15 that the clamping protrusions 33, 34 taper on their free ends to a point in order to facilitate the insertion into the clamping slots 30A, 31A.

A reliable connection between the element to which the first fastening section 30 is connected and the element to which the second fastening section 31 is connected or rather the element to which the resilient contact arm 25 is pressed is produced by means of the embodiment of the contact bridge 24, independently of whether by way of example these elements vibrate during the operation of the motor. A ground potential can therefore be reliably produced from a grounding element, by way of example as an element of a connecting device, to a bearing plate.

Figure 16:
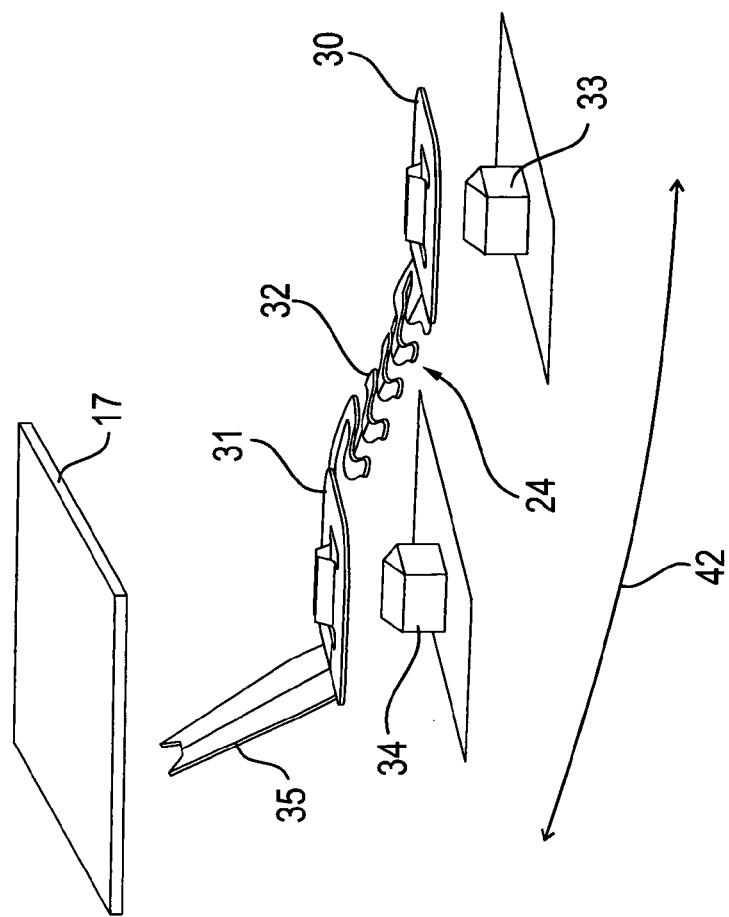
FIG. 16 illustrates the bridging element from FIG. 15 from another view.

FIG. 16 illustrates the contact bridge 24 in FIG. 15 in a perspective somewhat altered view, wherein it becomes clear that the contact bridge 24 can be slightly bent out from the sheet metal plane, however said contact bridge extends essentially in a longitudinal direction that is indicated by means of the double arrow 42. The double arrow 42 is also indicated in FIG. 15. The fastening sections 30, 31 are slightly angled with respect to the bridging element 32. In addition, the clamping protrusions 33, 34 are illustrated.

Figure 17:
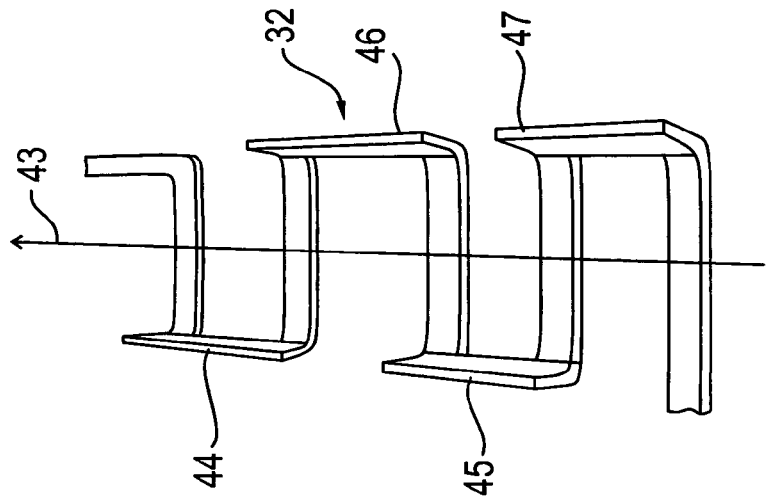
FIG. 17 illustrates in a three-dimensional view an illustration of a meandering resilient metal sheet.

FIG. 17 illustrates in a perspective view the bridging element 32 having multiple meandering conductor windings in the longitudinal direction of the bridging element 32 or rather the contact bridge 24. It is indicated that the lateral conductor sections 44, 45, 46, 47 of the meandering conductor arrangement that are essentially aligned in the longitudinal direction 43 of the bridging element, are bent out of the plane of the remaining conductor sections in a perpendicular manner in other words out of the plane of the sheet metal and the fastening sections 30, 31 in such a manner that these conductor sections 44, 45, 46, 47 extend parallel to the longitudinal direction 43 and perpendicular to the sheet metal plane. The bent edges of the mentioned bent conductor sections are in the exemplary embodiment parallel to the longitudinal direction 43 of the bridging element 32.

As a consequence, in this region of the mentioned bent out conductor sections 44, 45, 46, 47, a sideways curve of the bridging element 32 is facilitated within the plane of the resilient metal sheet that coincides with the plane of the remaining conductor sections of the bridging element 32. Overall, as a result of providing these perpendicularly bent, cheek-like conductor sections 44, 45, 46, 47 the flexibility of the bridging element 32 is consequently increased.

Figure 18:
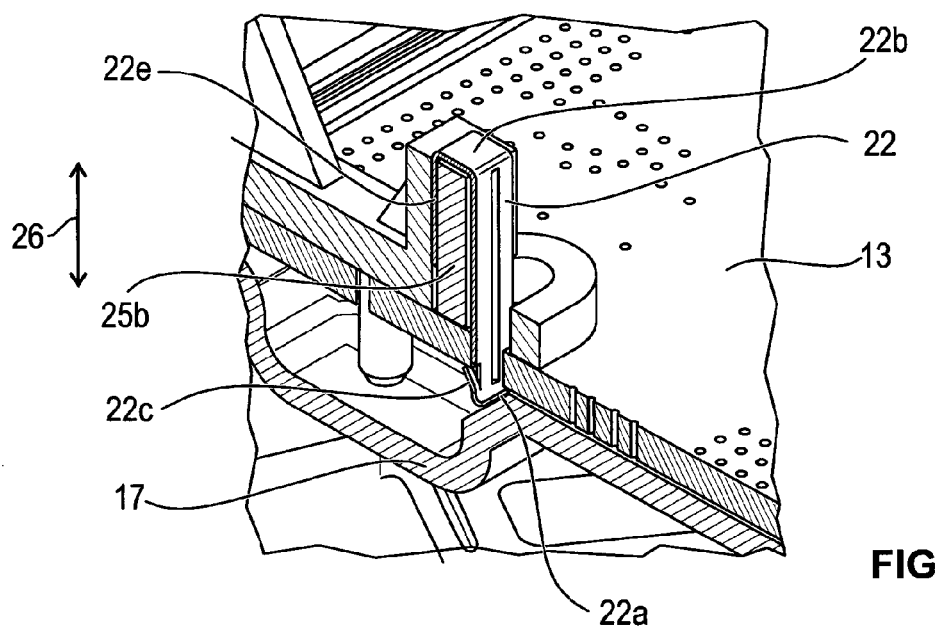
FIG. 18 illustrates a further embodiment of the sheet metal tongue having a guiding rail.

FIG. 18 illustrates a further embodiment of the sheet metal tongue 22 and the guiding rail 25b, along which during assembly, the sheet metal tongue 22 can be displaced in the direction of the double arrow 26.

The sheet metal tongue 22 comprises on its upper end a flat piece 22b that is embodied in this case as a right-angled end of the sheet metal tongue. In the assembled state, said flat piece lies on the guiding rail 25b and becomes a further, for this purpose right-angled flat piece 22e so that the cross section of the sheet metal tongue 22 is essentially U-shaped.

On the lower end of the sheet metal tongue 22 that is opposite the flat piece, the pressure contact piece 22a is evident in the form of a likewise bent end. The latching lug 22c is located at that location and said latching lug forms a rear engagement to the circuit board 13. In other words, the circuit board 13 and the guiding rail 25b are clamped between the flat piece 22b and the circuit board 13 in a non-positive locking manner. As a result of the latching arrangement, the sheet metal tongue 22 is prevented from falling out of the clamping device 25.

Figure 19A:
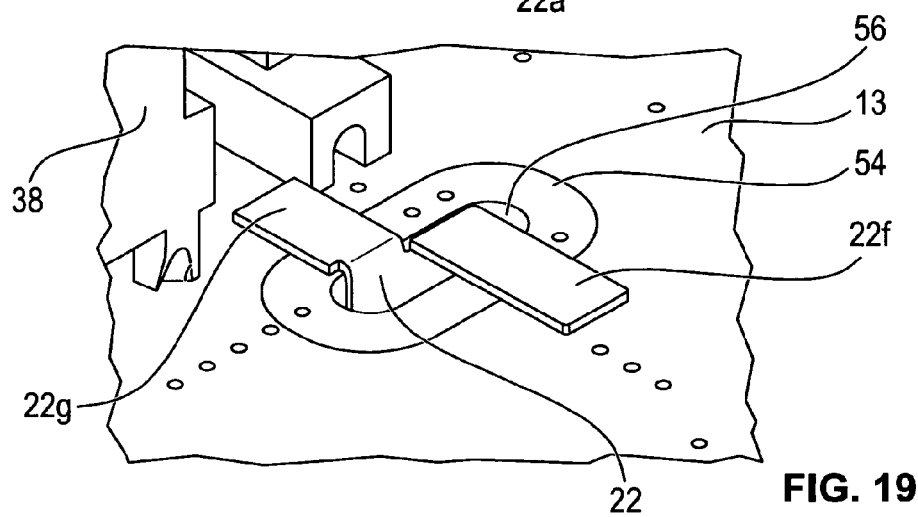
FIGS. 19A and 19B illustrate a further embodiment of the sheet metal tongue without a guiding rail.
Figure 19B:
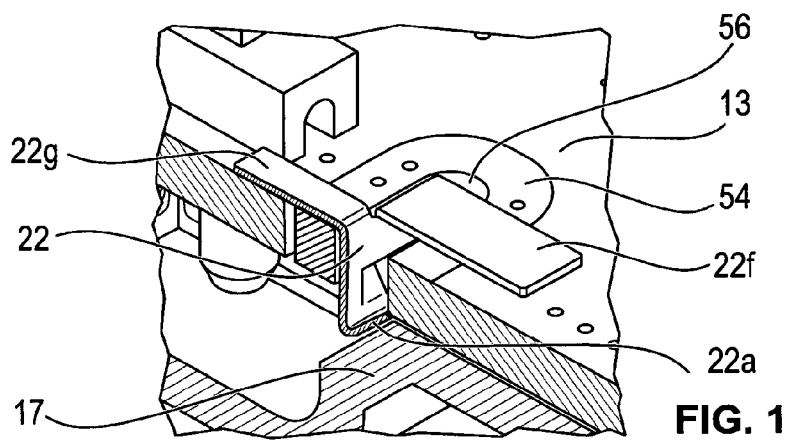

FIGS. 19a and 19b illustrate a further embodiment of the sheet metal tongue 22 in a perspective view or rather in a perspective sectional view. The sheet metal tongue 22 is embodied in a shortened manner in comparison to the embodiment that is illustrated in FIG. 18. The flat pieces 22b and 22e are thus omitted, whereas the latching lug 22c and the pressure contact piece 22a correspond to the corresponding components that are illustrated in FIG. 18. The end of the sheet metal tongue 22 that lies opposite the pressure contact piece 22a is cut on its free end side to form two arms 22f, 22g. The two arms 22f, 22g are in each case angled at 90°, wherein the direction for this purpose is antiparallel. In other words, in the case of a plan view of the circuit board 13 and the sheet metal tongue 22, the outline that is formed of the sheet metal tongue 22 is essentially Z- or rather S-shaped.

The arms 22f, 22g lie on a limiting ring 54 that is produced from a conductive material, and a border of an elongated hole 56 that is integrated into the circuit board 13 is formed by means of said limiting ring. This elongated hole 56 is connected to ground. By way of example, a stranded wire is soldered to the limiting ring 54 or a conductor track leads from the limiting ring 54 to the grounding element 28.

Figure 20:
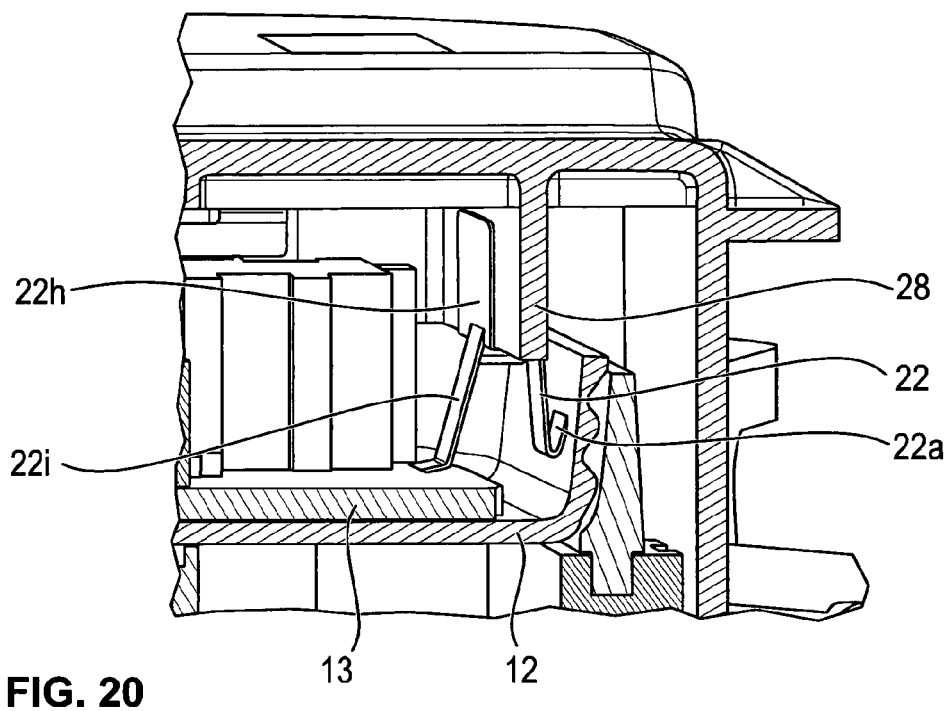
FIGS. 20-22 illustrate in each case further embodiments of the sheet metal tongue.

FIG. 20 illustrates a further embodiment of the sheet metal tongue 22. This sheet metal tongue comprises a clamp 22h that is located on the end that lies opposite the pressure contact piece 22a. The clamp 22h is attached to the grounding element 28 in a non-positive locking manner and in this case the grounding element is in the form of a connecting piece of a cover. In other words, the connecting piece of the cover is located between the clamping arms of the clamp 22h, said clamping arms being parallel to one another. The pressure contact piece 22a lies on the shielding plate 17 so that an electrical connection between the shielding plate 17 and the grounding element 28 is achieved. A further sheet metal tongue 22i having a further free end side pressure contact piece is formed in a single part manner on the clamp 22h and said pressure contact piece lies on the circuit board 13. The circuit board 13 is stabilized by means of said pressure contact piece. In addition, in this manner the circuit board 13 can be connected to the grounding element 28 by way of the sheet metal tongue 22i.

Figure 21:
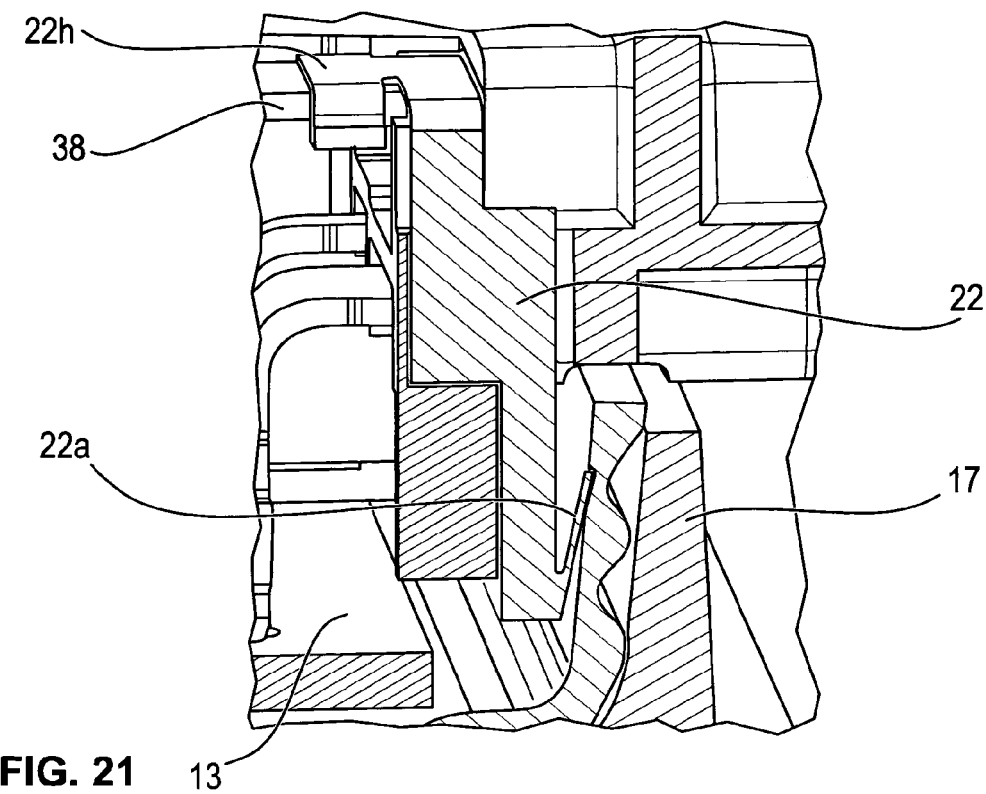

FIG. 21 illustrates a further embodiment of the sheet metal tongue 22 having the pressure contact piece 22a that lies on the shielding plate 17. In this variant, the clamp 22h is fastened to one of the connecting conductors 38 by means of a non-positive locking connection that is represented by the grounding element 28.

Figure 22:
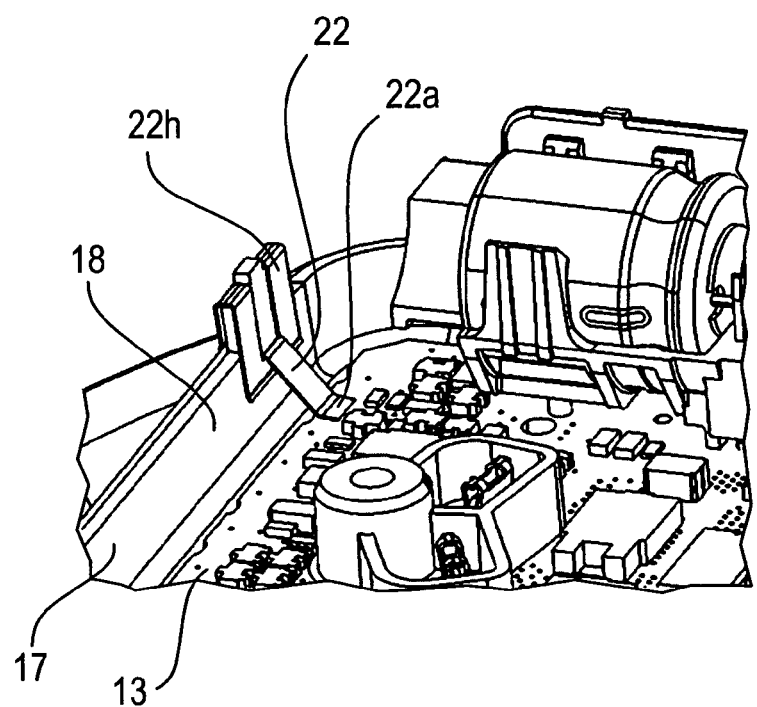

FIG. 22 illustrates in sections a further embodiment of the sheet metal tongue 22. The sheet metal tongue 22 in turn comprises the clamp 22h that in this case however is attached to the edge 18 of the shielding plate 17. In other words, a non-positive locking connection between the clamp 22h and the shielding plate 17 is produced. The pressure contact piece 22a is in direct mechanical contact with the circuit board 13 and in this manner produces an electrical connection between the circuit board 13 and the shielding plate 17. A conductor track, not further illustrated, of the circuit board 13 is located below the pressure contact piece 22a and said conductor track is electrically connected to the grounding element 28. An electrical connection between the shielding plate 17 and the grounding element 28 is achieved in this manner.

Overall, a reliable and low resistance connection of the stator and rotor parts that are to be connected to ground potential and also of the bearing plate of an electric motor to a grounding element or rather a grounding connection is improved by means of the described measures and features in accordance with the invention so that overall the electromagnetic shielding arrangement of the windings of the electrical machine that are influenced by signals is improved and the stability with respect to voltage arcs is likewise improved by means of a ground connection having a low resistance and low impedance.

The invention claimed is:
1. A rotary electrical machine, comprising:
a winding;
an electronic control device;
an electrically conductive shielding plate arranged between said control device and said winding;
a connecting device with at least one coupling element for electrically connecting said control device to one or a plurality of lines and a grounding element for connecting to an electrical ground potential;
a sheet metal tongue electrically connecting said shielding plate to said grounding element by way of an electrical pressure contact;
a connecting conductor conductively connecting said sheet metal tongue to said grounding element, wherein said connecting conductor is electrically contacted by said sheet metal tongue by way of a pressure contact;
said control device including a circuit board having conductor tracks, and said connecting conductor including at least one section of a conductor track of said control device; and
said sheet metal tongue penetrating a plane of said circuit board and projecting through a cut-out formed in said circuit board, and said sheet metal tongue being mechanically held in a clamping device and electrically connected to said grounding element or to said shielding plate.

2. The rotary electrical machine according to claim 1, wherein at least one element of said clamping device is connected to said circuit board.

3. The rotary electrical machine according to claim 2, wherein said at least one element of said clamping device is an insulating element.

4. The rotary electrical machine according to claim 2, wherein at least one element of said clamping device is rigidly connected to said grounding element.

5. The rotary electrical machine according to claim 4, wherein said at least one element of said clamping device that is rigidly connected to said grounding element is an electrically conductive element.

6. The rotary electrical machine according to claim 2, wherein:
said sheet metal tongue extends substantially in a longitudinal direction; and
said clamping device comprises at least one guiding rail in which said sheet metal tongue is displaceably guided in the longitudinal direction thereof.

7. The rotary electrical machine according to claim 6, wherein said clamping device comprises a counter bearing and said sheet metal tongue is pressed against said guiding rail by way of said counter bearing.

8. The rotary electrical machine according to claim 7, wherein said guiding rail or said counter bearing cooperate with said sheet metal tongue to form a latch connection.

9. The rotary electrical machine according to claim 1, wherein said sheet metal tongue cooperates by way of a second pressure contact piece with a given conductor track of said circuit board in a pressure contact connection and electrically connects said given conductor track to said grounding element.

10. The rotary electrical machine according to claim 1, which comprises a stator and a rotor at least in part connected to ground potential.

11. The rotary electrical machine according to claim 1, configured as an electric motor with a stator and a rotor.

12. The rotary electrical machine according to claim 1, configured as a brushless rotary electrical machine.

13. The rotary electrical machine according to claim 1, wherein said sheet metal tongue is pressed in a resilient manner against a connecting conductor.

14. A control device for an electrical machine, the control device comprising:
- a circuit board formed with a cutout;
- a clamping device;
- a resilient sheet metal tongue held in said clamping device, projecting through a plane of said circuit board, and being connected to ground potential;
- said sheet metal tongue being configured to produce an electrical pressure contact to an electrically conductive shielding plate adjacent said circuit board;
- wherein at least one element of said clamping device is connected to said circuit board; and
- wherein said sheet metal tongue projects through a cut-out formed in said circuit board.

15. The control device according to claim 14, wherein said at least one element is an insulating element.

16. The control device according to claim 14, wherein said sheet metal tongue is pressed in a resilient manner against a connecting conductor.

* * * * *